United States Patent [19]

Mori et al.

[11] Patent Number: 5,534,730
[45] Date of Patent: Jul. 9, 1996

[54] CONDUCTIVE LAYER CONNECTION STRUCTURE OF A SEMICONDUCTOR DEVICE AND A METHOD OF MANUFACTURING THEREOF

[75] Inventors: Kenichi Mori; Katsuhiro Tsukamoto, both of Hyogo-ken, Japan

[73] Assignee: Mitsubishi Denki Kabushiki Kaisha, Tokyo, Japan

[21] Appl. No.: 423,476

[22] Filed: Apr. 19, 1995

Related U.S. Application Data

[63] Continuation of Ser. No. 180,823, Jan. 7, 1994, abandoned, which is a continuation of Ser. No. 970,703, Nov. 3, 1992, abandoned.

[30] Foreign Application Priority Data

Nov. 11, 1991 [JP] Japan ..................................... 3-323923
Mar. 9, 1992 [JP] Japan ..................................... 4-050839

[51] Int. Cl.$^6$ .......................... H01L 21/285; H01L 29/41; H01L 29/43
[52] U.S. Cl. .......................... 257/757; 257/763; 257/764; 257/765; 257/915
[58] Field of Search ..................................... 257/751, 915, 257/763, 752, 913, 384, 757, 764, 765, 767

[56] References Cited

U.S. PATENT DOCUMENTS

| | | | |
|---|---|---|---|
| 3,887,993 | 6/1975 | Okada et al. | 257/384 |
| 4,884,123 | 11/1989 | Dixit et al. | 257/751 |
| 4,898,841 | 2/1990 | Ho | 257/752 |
| 4,924,295 | 5/1990 | Küecher | 257/763 |
| 4,957,777 | 9/1990 | Ilderem et al. | 427/55 |
| 4,962,414 | 10/1990 | Liou et al. | 257/751 |
| 4,966,865 | 10/1990 | Welch et al. | 257/752 |
| 4,985,750 | 1/1991 | Hoshino | 257/751 |
| 5,008,730 | 4/1991 | Huang et al. | 257/751 |
| 5,112,765 | 5/1992 | Cederbaum et al. | 437/41 |
| 5,196,916 | 3/1993 | Ishigami et al. | 257/751 |
| 5,208,170 | 5/1993 | Kobeda et al. | 437/183 |
| 5,216,282 | 6/1993 | Cote et al. | 257/752 |
| 5,275,715 | 1/1994 | Tuttle | 437/192 |

FOREIGN PATENT DOCUMENTS

| | | | |
|---|---|---|---|
| 0055861 | 3/1989 | Japan | 257/752 |
| 0059937 | 3/1989 | Japan | 257/915 |
| 0192768 | 8/1991 | Japan | 257/763 |

OTHER PUBLICATIONS

D. S. Williams et al., "Nitrogen, oxygen, and argon incorporation during reactive sputter deposition of titanium nitride," J. Vac. Sci. Technol., B5 (6), Nov./Dec. 1987, pp. 1723–1729.

N. G. Einspruch et al, "VLSI Electronics—Microstructure Science—Vol. 15 VLSI Metallization", Academic Press, Inc., 1987, pp. 107–140.

Yokoyama et al, "LPCVD Titanium Nitride for ULSIs", J. Electrochem. Soc., Vol. 138, No. 1 (Jan. 1991), pp. 190–195.

Raaijmakers et al, "Contact Hole Fill With Low Temperature LPCVD TiN", VMIC Conference, 1990, pp. 219–225 IEEE.

*Primary Examiner*—Peter Toby Brown
*Attorney, Agent, or Firm*—Lowe, Price, LeBlanc & Becker

[57] ABSTRACT

A natural oxide film formed on an impurity region exposed in the formation of a through-hole is reduced by a titanium silicide layer formed by a CVD method. The natural oxide film is reduced at the time of forming the titanium silicide film. The silicon used for forming the titanium silicide film is supplied from a gas including silicon. Therefore, the titanium silicide film can be prevented from intruding excessively into the impurity region.

16 Claims, 16 Drawing Sheets

1

CONDUCTIVE LAYER CONNECTION STRUCTURE OF A SEMICONDUCTOR DEVICE AND A METHOD OF MANUFACTURING THEREOF

This application is a continuation of application Ser. No. 08/180,823 filed Jan. 7, 1994, and now abandoned, which is a continuation of Ser. No. 07/970,703 filed Nov. 3, 1992, also abandoned.

BACKGROUND OF THE INVENTION

1. Field of the Invention

The present invention relates to a conductive layer connection structure of a semiconductor device electrically connecting an upper conductive layer and a lower conductive layer, and a method of manufacturing thereof. More particularly, it relates to a manufacturing method of a conductive layer connection structure of a semiconductor device having a natural oxide film removed using a titanium silicide layer, and a conductive layer connection structure formed using the method thereof.

2. Description of the Background Art

Sputtering and CVD (Chemical Vapor Deposition) are well known as film deposition techniques. Sputtering has an advantage that a film is easily obtained without the need of adjusting the gas flow and temperature as in the case using CVD. A method of forming an upper conductive layer using sputtering will be described hereinafter.

Referring to FIG. 17, an interlayer insulation film 3 is formed on a lower conductive layer 5. A through-hole 9 is formed in interlayer insulation film 3 reaching lower conductive layer 5. By colliding Ar ions with an aluminum plate 1, the aluminum atoms fall downwards due to the collusion. This process is continued to result in the state shown in FIG. 19 via the state of FIG. 18. Reference number 7 indicates an upper conductive layer of aluminum.

However, the aluminum atoms do not fall down perpendicularly as shown in FIG. 17 in practice. The fall of the aluminum atoms caused by the collusion of Ar ions is seen in various directions as shown in FIG. 20. An aluminum film is not easily formed at the corner 10 of through-hole 9.

The opening dimension of through-hole 9 has become smaller in accordance with the size of devices becoming smaller. The thickness of interlayer insulation film 3 is substantially fixed to a constant value considering the possibility of a pin hole. Therefore, the aspect ratio (hole depth/opening size of hole) of the through-hole is inevitably increased. A higher aspect ratio makes it further difficult for the aluminum atoms to reach corner 10 of through-hole 9. This will induce problems that will be described hereinafter.

FIG. 21 is a sectional view of a semiconductor device where an upper conductive layer 7 of aluminum is being formed on interlayer insulation film 3 having through-hole 9 of a high aspect ratio. FIG. 22 shows the state of the semiconductor device after the formation of upper conductive layer 7. It can be seen that the opening of through-hole 9 is clogged up with aluminum before the internal of through-hole 9 is fully filled with aluminum, resulting in a void 11 in through-hole 9. Void 11 will cause a higher electrical resistance in the aluminum film in through-hole 9. This results in a greater possibility of electromigration at this portion. Electromigration is a phenomenon of metal atoms being moved when a great current stress is applied to the metal. If the metal atoms travel in a direction opposite to that of the current, there will be no aluminum at the cathode side to create a void, whereas aluminum gathers at the anode side to generate hillocks and whiskers. The defect caused by electromigration includes increase in interconnection resistance and disconnection on account of voids and short circuit between multilayer interconnections on account of hillocks and whiskers.

Therefore, an upper conductive layer is formed using a CVD method when the aspect ratio of a through-hole is great. According to the CVD method, a film is formed by the gas affecting the film formation face. Gas can easily diffuse into the corner of a through-hole. This means that the internal of a through-hole can be completely filled up even if the through-hole has a great aspect ratio.

A method of filling up a through-hole with a conductive layer by a CVD method will be described hereinafter. This method is disclosed in, for example, 1990 IEEE Jun. 12–13, 1990 VMIC Conference pp. 219–225 "CONTACT HOLE FILL WITH LOW TEMPERATURE LPCVD TiN" Ivo J. Raaijmakers et al.

Referring to FIG. 23, interlayer insulation film 19 is selectively etched to form a through-hole 21 reaching to impurity region 17. Reference number 13 indicates a silicon substrate, and reference number 15 a field oxide film. Referring to FIG. 24, a natural oxide film 23 is formed on the exposed impurity region 17 by the oxygen in the atmosphere. Because the presence of natural oxide film 23 will degrade the electrical connection between impurity region 17 and a TiN film that will be formed afterwards, natural oxide film 23 is reduced as follows.

Referring to FIG. 25, a Ti film 25 is formed all over the main surface of silicon substrate 13 by sputtering.

Referring to FIG. 26, silicon substrate 13 is subjected to heat treatment in a nitrogen atmosphere at a temperature of 650° C. for 30 seconds. The portion of the Ti film in contact with interlayer insulation film 19 becomes a TiN (O) film 29. TiN (O) film 29 is a film having oxygen dispersed in a TiN film.

Regarding the portion of the Ti film in contact with impurity region 17, Ti diffuses into impurity region 17 to be bonded to Si in impurity region 17 to result in $TiSi_x$ 27 ($0<x<2$). Because $TiSi_x$ is reductive, a portion of $TiSi_x$ reacts with 0 in the natural oxide film to become TiSiO. Thus, the natural oxide film is reduced.

Referring to FIG. 27, TiN film 31 is formed all over the main surface of silicon substrate 13 by a CVD method. Through-hole 21 can be completely filled up with TiN film 31 even if the aspect ratio of through-hole 21 is great because the formation is carried out by a CVD method.

Referring to FIG. 28, Al-Cu film 33 is formed on TiN film 31. Al-Cu film 33 serves to improve the conductivity of the interconnection layer.

In the above-described conventional method, the Si used in the formation of $TiSi_x$ 27 is supplied from impurity region 17. If the reaction between Ti and Si is carried out excessively, $TiSi_x$ 27 will break through impurity region 17 as shown in FIG. 29 to damage the pn junction. Thus, leakage of current occurs.

The thickness of upper interconnection layer is great because of its three layered structure of Al-Cu film 33, TiN film 31, and TiN (O) film 29. This will result in a greater stepped portion in the layer above the upper layer interconnection layer with problems such as a possibility of disconnection in an interconnection layer above the the upper layer interconnection layer.

SUMMARY OF THE INVENTION

The present invention is provided to solve the above-described conventional problems.

An object of the present invention is to provide a method of manufacturing a conductive layer connection structure of a semiconductor device that can have the conductive layer used for reducing a natural oxide film prevented from intruding excessively into a lower conductive layer.

Another object of the present invention is to provide a conductive layer connection structure of a semiconductor device having a conductive layer used for reducing a natural oxide film not excessively intruding into a lower conductive layer.

A further object of the present invention is to provide a method of manufacturing a conductive layer connection structure of a semiconductor device that can prevent damage of a pn junction.

Still another object of the present invention is to provide a conductive layer connection structure of a semiconductor device that can have the electrical resistance of the conductive layer in a through-hole reduced.

A still further object of the present invention is to provide a conductive layer connection structure of a semiconductor device that can have the step reduced.

According to an aspect of the present invention, an insulation layer formed on a lower conductive layer is selectively removed by etching to form a through-hole reaching to the lower conductive layer. A natural oxide film is formed on the lower conductive layer in the through-hole. By a CVD method using a gas including titanium and a gas including silicon, or by a sputtering method with titanium silicide as a target, a titanium silicide layer is formed on the natural oxide film to reduce the natural oxide film. Then, a connection conductive layer for electrically connecting an upper conductive layer and the lower conductive layer is formed. Finally, an upper conductive layer is formed on an insulation film for electrical connection with the connection conductive layer.

According to another aspect of the present invention, an insulation layer formed on a lower conductive layer and having a through-hole reaching to the lower conductive layer, a titanium silicide layer formed on the lower conductive layer in the through-hole, and a connection conductive layer formed of TiN for electrically connecting the titanium silicide layer and the upper conductive layer are provided. There is no TiN (O) in the through-hole. An upper conductive layer is formed on the insulation layer, which is electrically connected with the connection conductive layer.

According to a further aspect of the present invention, a through-hole is filled up with a connection conductive layer formed of only TiN, only Ti, or only $TiSi_2$ using a CVD method. An upper conductive layer of a single layer structure is formed on the insulation film for electrical connection with the connection conductive layer.

According to the aspect of the present invention, the natural oxide film is reduced using a titanium silicide layer formed by a CVD method or a sputtering method. More specifically, the natural oxide film is reduced in forming a titanium silicide layer. The silicon used for forming the titanium silicide layer is supplied from a gas including silicon in the case of the CVD method and from a target in the case of sputtering. Therefore, the titanium silicide layer can be prevented from excessively intruding into the lower conductive layer.

The another aspect of the present invention is a conductive layer connection structure manufactured by the first aspect. TiN, not TiN (O), is formed in the through-hole. TiN has a lower electrical resistance in comparison with TiN (O). Therefore, the electrical resistance of the conductive layer in the through-hole can be reduced.

The further aspect of the present invention allows reduction in the stepped portion because the upper conductive layer is formed of a single layer structure.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
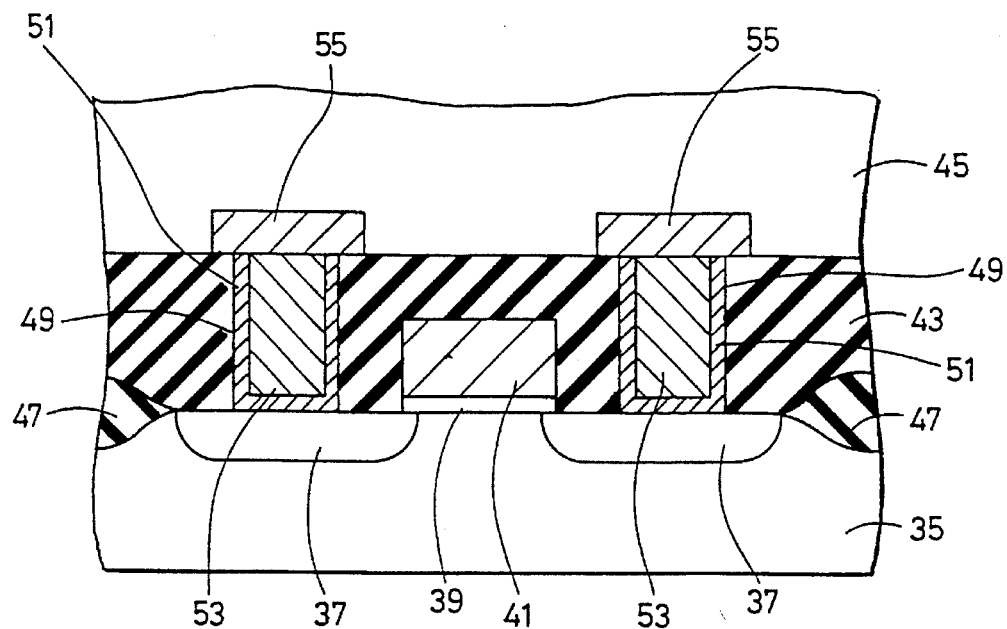
FIG. 1 is a sectional view of a MOS field effect transistor manufactured according to a first embodiment of the present invention.

FIG. 1 is a sectional view of a MOS field effect transistor according to a first embodiment of the present invention.

Impurity regions 37 are formed with a distance therebetween on a silicon substrate 35. The field effect transistor includes a gate oxide film 39 and a gate electrode 41. Interlayer insulation film 43 is formed on silicon substrate 35. A through-hole 49 is formed in interlayer insulation film 43 reaching to impurity region 37. A TiSi$_x$ film (titanium silicide film) 51 is formed on impurity region 37 and at the sidewall of through-hole 49. Through-hole 49 is filled up with TiN film 53. An Al film 55 is formed on interlayer insulation film 43 to be electrically connected with TiN film 53. Reference number 45 indicates an insulation film.

Figure 2:
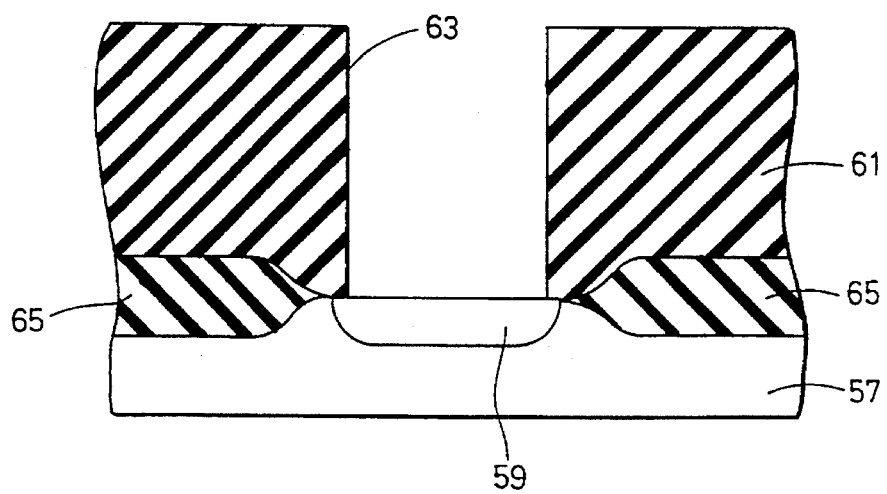
FIGS. 2–7 are sectional views of the MOS field effect transistor of the first embodiment of the present invention showing the 1st–6th manufacturing steps, respectively.

The first embodiment of the present invention will be described hereinafter. Referring to FIG. 2, impurity region 59 is formed in silicon substrate 57. Reference number (65) is a field oxide film. Interlayer insulation film 61 is formed all over silicon substrate 57. Through-hole 63 is formed in interlayer insulation film 61 reaching to impurity region 59.

Figure 3:
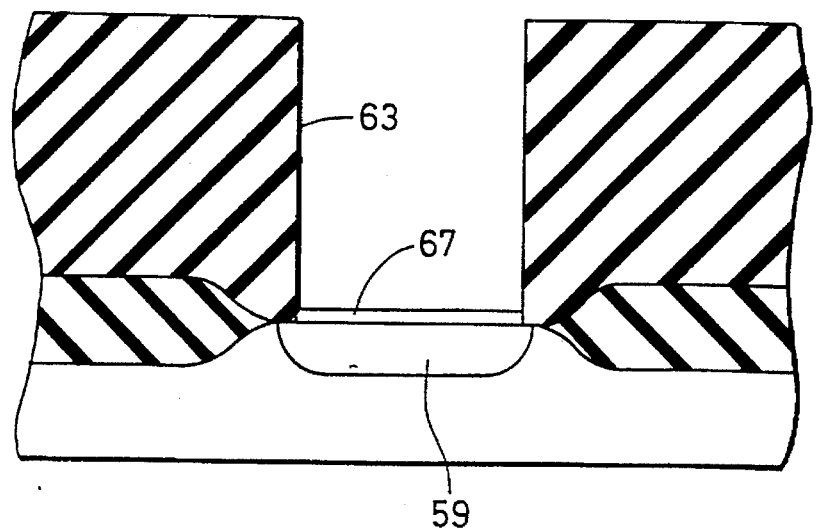

Referring to FIG. 3, natural oxide film 67 is formed on impurity region 59 by the oxygen in the atmosphere.

Figure 4:
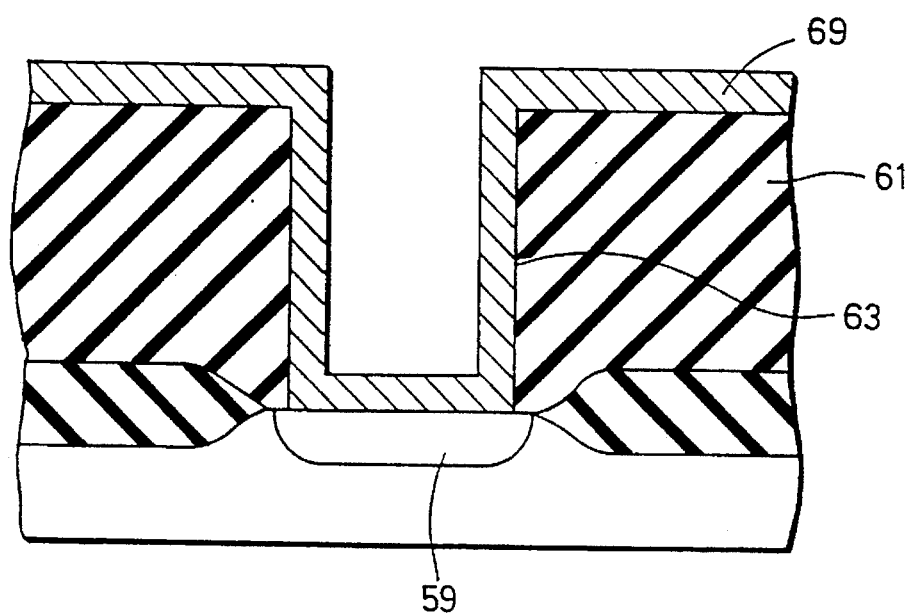

In order to reduce natural oxide film 67, titanium silicide film 69 is formed by a CVD method as shown in FIG. 4. The conditions are as follows.

Temperature: 700°–800° C.

Pressure: 20–40 Pa

Gas flow: TiCl$_4$ 25 sccm SiH$_4$ 50–200 sccm

Film growth rate: 20–40 mn/min

The titanium silicide film formed by this CVD is TiSi$_x$, where x is 0<x<2. x<2 is established because titanium silicide will become stable if x=2, resulting in weak reduction. The reaction formula showing the reduction of a natural oxide film is:

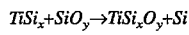

$$TiSi_x + SiO_y \rightarrow TiSi_xO_y + Si$$

SiO$_y$ represents a natural oxide film. y is a value near 2. This means that the film is not SiO$_2$ because the natural oxide film was not formed by positively supplying oxygen to the silicon. It is also to be noted that all the titanium silicide does not become TiSi$_x$O$_y$. A majority of titanium silicide remains as it is, and only a little TiSi$_x$O$_y$ exists in the titanium silicide. The above formula is only an example of indicating reduction of a natural oxide film, and the natural oxide film can be reduced by various reactions in practice. The natural oxide film may also be reduced by forming a titanium silicide film by sputtering with titanium silicide as a target.

Figure 5:
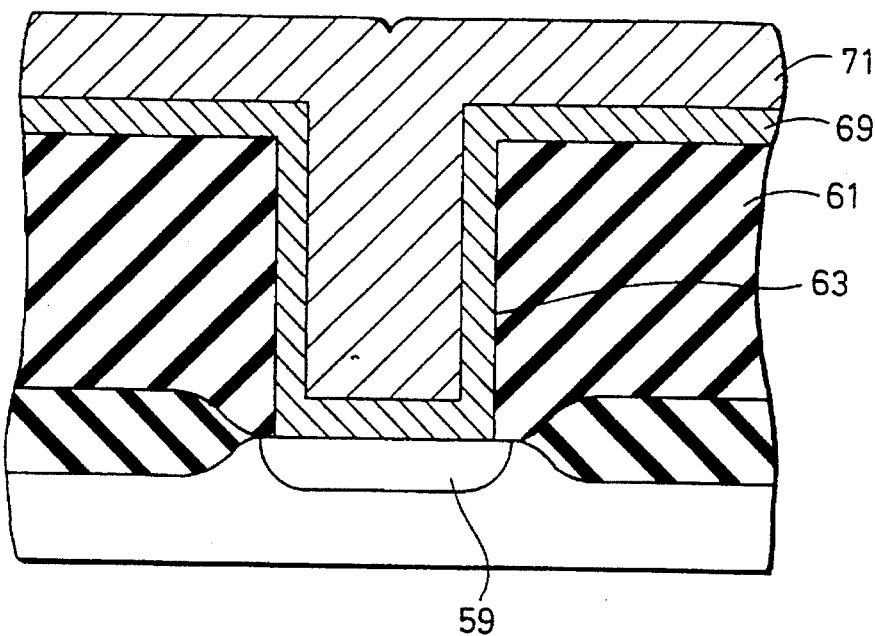

TiN film 71 was formed on titanium silicide film 69, as shown in FIG. 5. The conditions are as follows:

Temperature: 400°–800° C. (preferably, 400°–800° C.)

Pressure: 1–100 Pa

Gas flow: TiCl$_4$ 25 sccm NH$_3$ 25–100 sccm

Dilute gas: N$_2$ 0–300 sccm (preferably, 250 sccm)

Film growth rate: 70–150 Å/min

Ar can be used as dilute gas.

Figure 6:
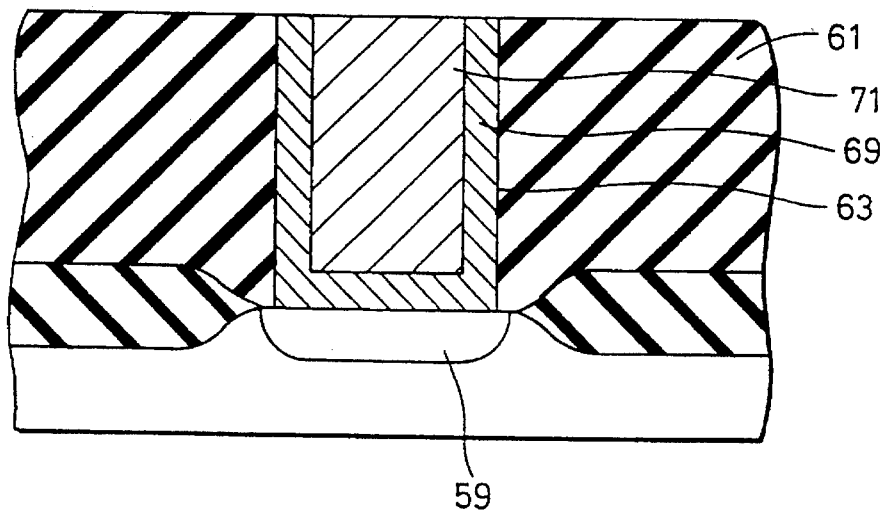

Referring to FIG. 6, TiN film 71 and titanium silicide film 69 are etched all over to leave titanium silicide film 69 and TiN film 71 only in through-hole 63.

Figure 7:
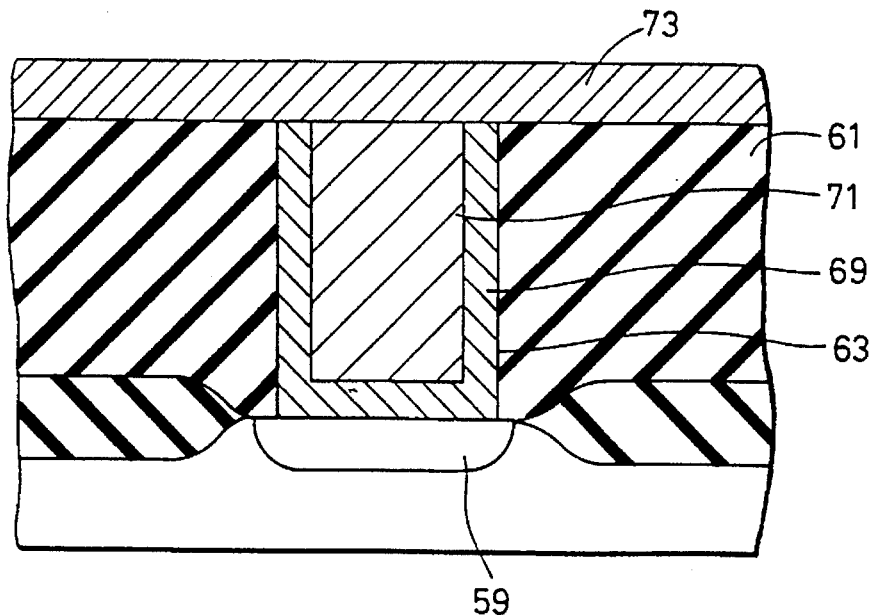

Referring to FIG. 7, Al film 73 is formed on interlayer insulation film 61 by a sputtering method. This completes the first embodiment of the present invention.

The manufacturing time period can be reduced because the first embodiment of the present invention forms titanium silicide film 69 and TiN film 71 successively by a CVD method. The electrical resistance can be reduced since titanium nitride film is formed only of TiN. It is known that the electrical resistance is increased in proportion to the amount of oxygen in TiN. This is described in 1987 American Vacuum Society "Nitrogen, Oxygen, and Argon Incorporation During Reactive Sputter Deposition of Titanium Nitride" pp. 1723–1729.

Figure 8:
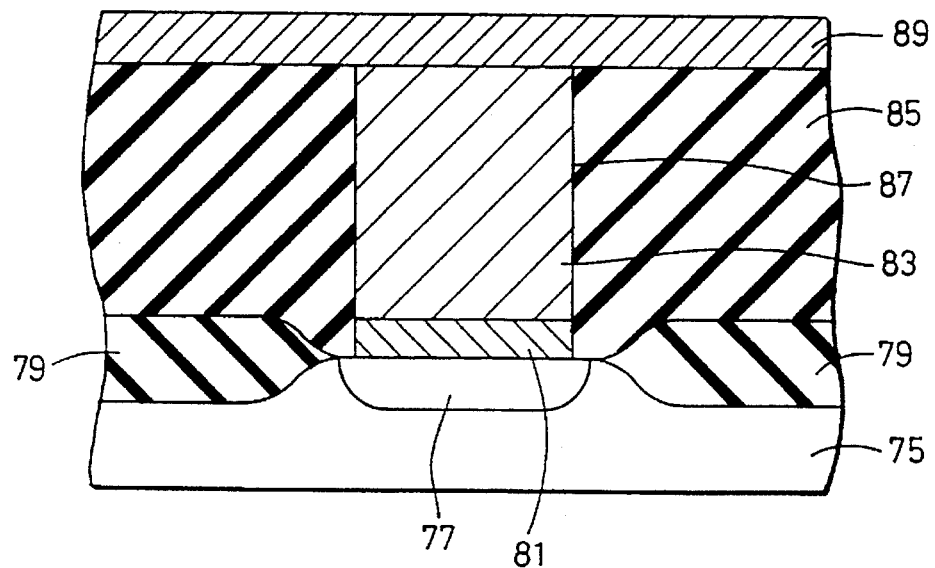
FIG. 8 is a sectional view of a conductive layer connection structure manufactured by a second embodiment of the present invention.

FIG. 8 is a sectional view of a conductive layer connection structure manufactured by a second embodiment of the present invention. According to the second embodiment, the natural oxide film on impurity region 77 is removed by titanium silicide film 81 formed on impurity region 77 by a selective CVD method. TiN film 83 is formed by a CVD method. The semiconductor device having the present conductive layer connection structure includes silicon substrate 75, field oxide film 79, interlayer insulation film 85, through-hole 87, and Al film 89.

Figure 9:
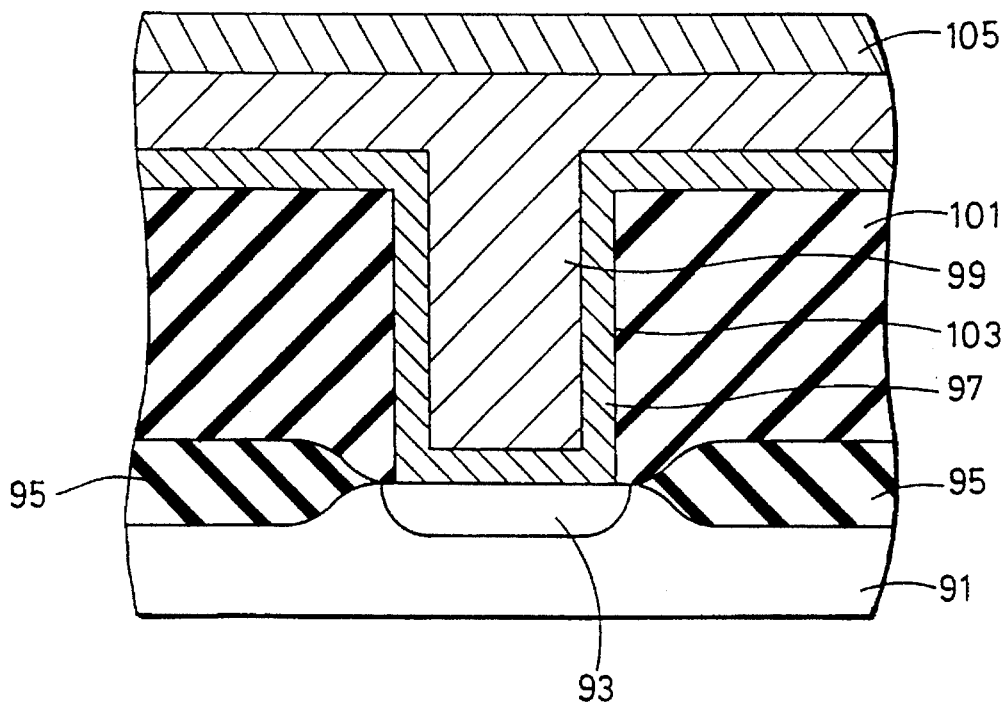
FIG. 9 is a sectional view of a conductive layer connection structure manufactured by a third embodiment of the present invention.

FIG. 9 is a sectional view of a conductive layer connection structure manufactured by a third embodiment of the present invention. The third embodiment includes a W film 105 as the upper conductive layer. Because W film 105 does not have good adherence to interlayer insulation film 101, TiN film 99 and titanium silicide film 97 are not entirely etched and remain. The semiconductor device having the present conductive layer connection structure includes silicon substrate 91, impurity region 93, field oxide film 95, and through-hole 103.

Figure 10:
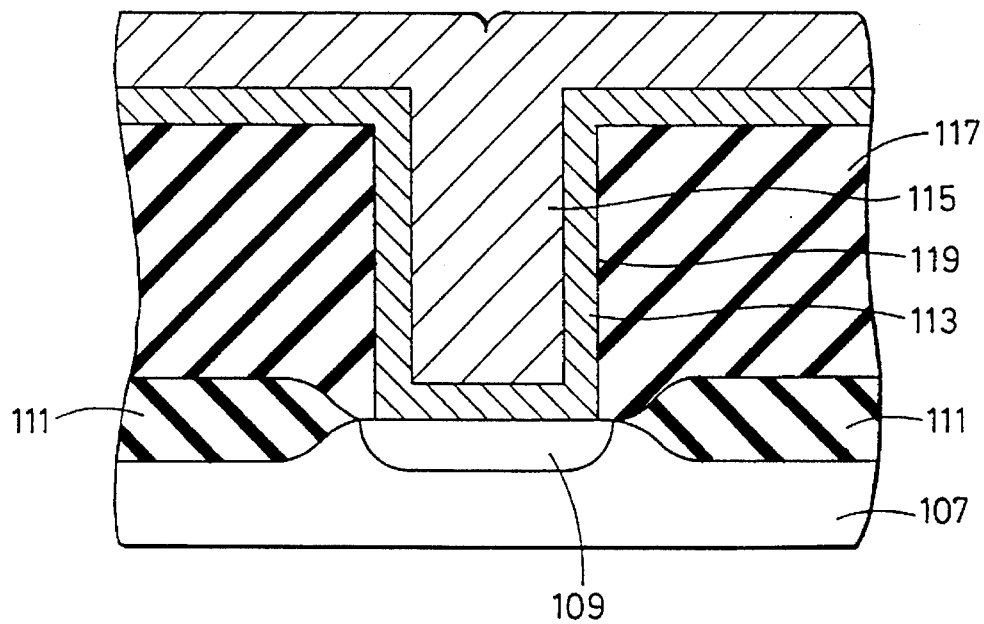
FIG. 10 is a sectional view of a conductive layer connection structure manufactured by a fourth embodiment of the present invention.

FIG. 10 is a sectional view of a conductive layer connection structure manufactured by a fourth embodiment of the present invention. The fourth embodiment employs titanium silicide film 113 and TiN film 115 as the upper conductive layer. The fourth embodiment has an advantage of simplifying the formation step of the upper conductive layer because the conductive layer filling through-hole 119 is implemented as the upper conductive layer. The semiconductor device having the present conductive layer connection structure includes silicon substrate 107, impurity region 109, field oxide film 111 and interlayer insulation film 117.

Figure 11:
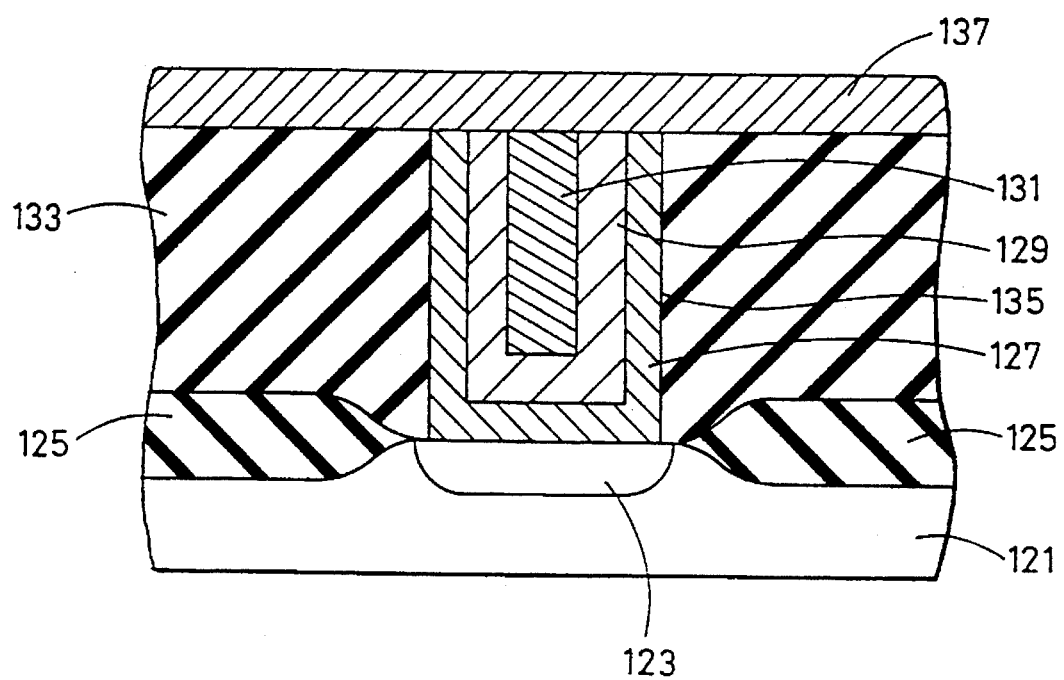
FIG. 11 is a sectional view of a conductive layer connection structure manufactured by a fifth embodiment of the present invention.

FIG. 11 is a sectional view of a conductive layer connection structure manufactured by a fifth embodiment of the present invention. The fifth embodiment does not have through-hole 135 entirely filled with TiN film 129, and a W film 131 is formed in the open space. W film 131 is formed by a CVD method. Because W has a low electrical resistance in comparison with TiN, it is possible to further lower the electrical resistance in the fifth embodiment in comparison with the first embodiment. The semiconductor device having the present conductive layer connection structure includes silicon substrate 121, impurity region 123, field oxide film 125, titanium silicide film 127, interlayer insulation film 133, and Al film 137.

Figure 12:
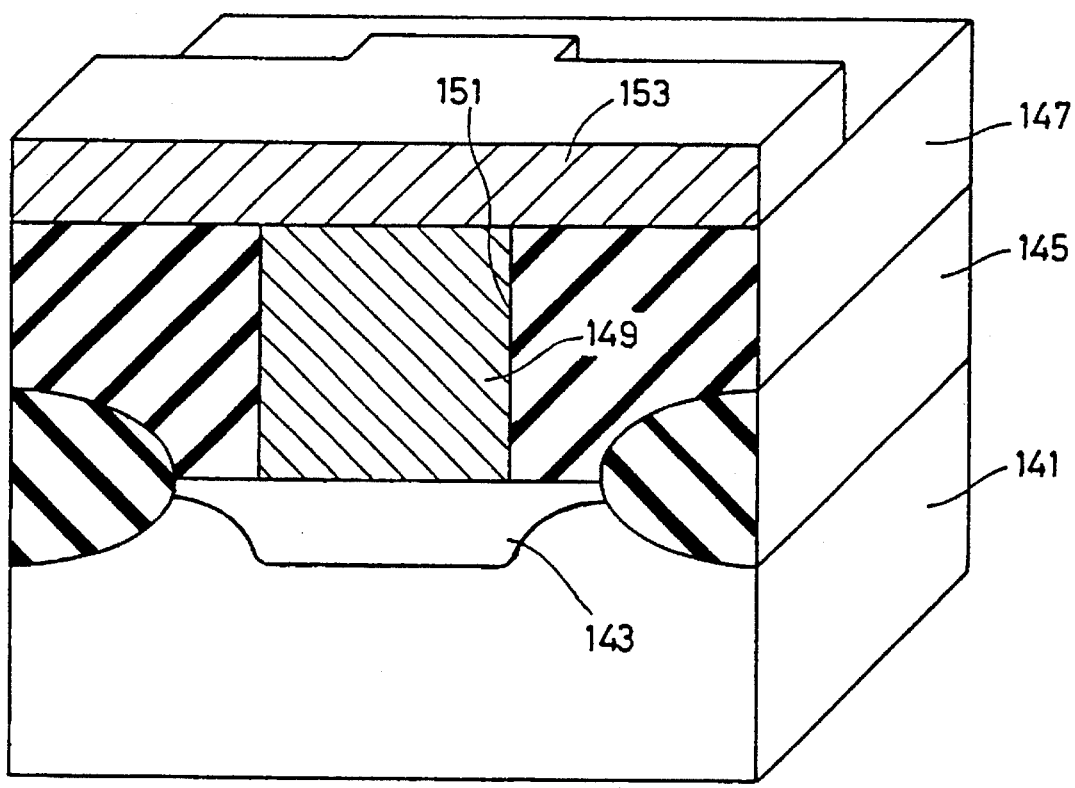
FIG. 12 is a sectional view of a conductive layer connection structure manufactured by a sixth embodiment of the present invention.

FIG. 12 is a sectional view of a conductive layer connection structure manufactured by a sixth embodiment of the present invention. Through-hole 151 is filled with TiN film 149. The upper conductive layer is formed only of a single layer of Al film 153. Therefore the thickness of the upper conductive layer is small, so that the layer extending over the upper layer conductive layer and the interlayer insulation film 147 will have a reduced stepped portion therein. The semiconductor device having the present conductive layer connection structure includes silicon substrate 141, impurity region 143, field oxide film 145, and interlayer insulation film 147.

FIG. 13 is a sectional view of the conductive layer connection structure manufactured by the sixth embodiment of the present invention where (a)–(e) show the manufacturing steps thereof. Referring to FIG. 13(a), through-hole 151 is formed in interlayer insulation film 147.

Figure 13A:
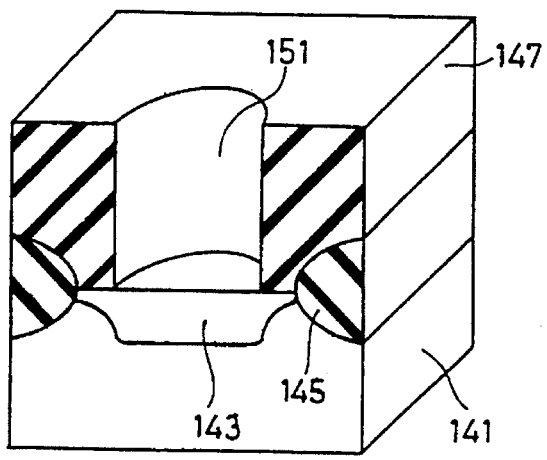
FIGS. 13(a)–13(e) sectional views of the conductive layer connection structure according to the sixth embodiment of the present invention showing a manufacturing step thereof.
Figure 13D:
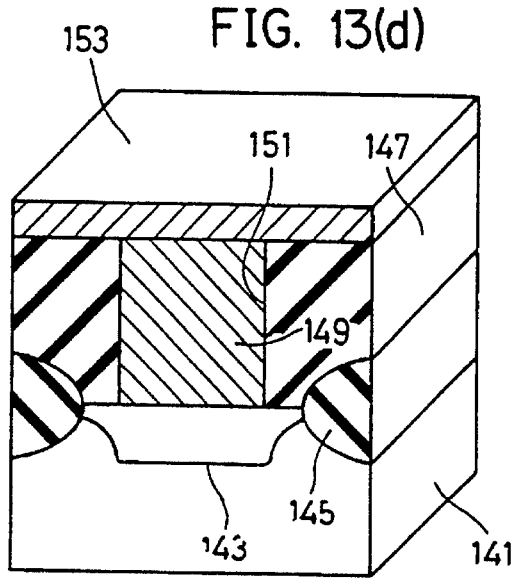
Figure 13B:
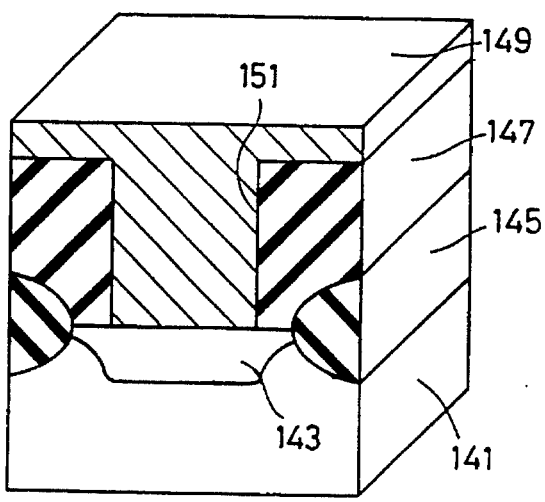

Referring to FIG. 13(b), TiN film 149 is formed by a CVD method. The conditions are as follows:

Temperature: 700° C.
Pressure: 50 Pa
Gas flow: TiCl$_4$ 25 sccm NH$_3$ 25 sccm
Dilute gas: N$_2$ 250 sccm Referring to FIG. 13(c), TiN film 149 formed on interlayer insulation film 147 was removed by etching back.

Figure 13E:
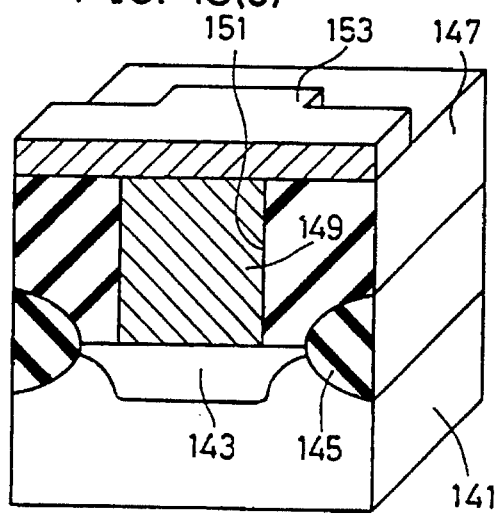
Figure 13C:
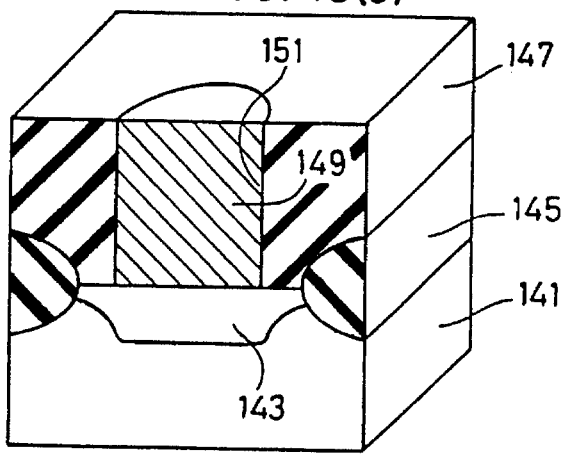

Referring to FIG. 13(d), Al film 153 is formed on interlayer insulation film 147 by a sputtering method. Referring to FIG. 13(e), a predetermined pattern was applied to Al film 153. Although through-hole 151 is entirely filled up with only TiN film 149 in the present embodiment, through-hole 151 may be filled up with only a titanium silicide film.

Figure 14:
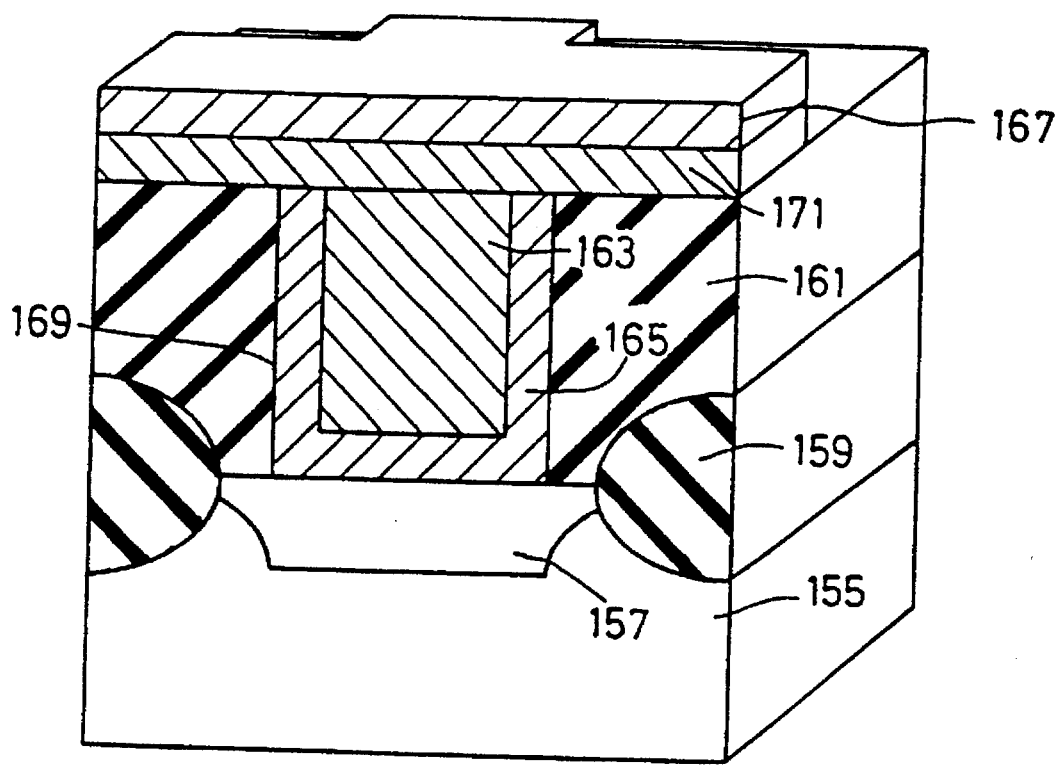
FIG. 14 is a sectional view of a conductive layer connection structure manufactured by a seventh embodiment of the present invention.

FIG. 14 is a sectional view of a conductive layer connection structure manufactured by a seventh embodiment of the present invention. Impurity region 157 is formed on silicon substrate 155. Through-hole 169 reaching to impurity region 157 is formed in interlayer insulation film 161. TiSi$_2$ film 165 is formed along the inner wall of through-hole 169. TiN film 163 is formed in the interior of TiSi$_2$ film 165. TiN film 171 is formed on interlayer insulation film 161 establishing electrical contact with TiN film 163 and TiSi$_2$ film 165. W film 167 is formed on TiN film 171. The upper conductive layer is formed of a two layered structure of TiN film 171 and W film 167 in order to reduce the thickness of the upper conductive layer.

The seventh embodiment of the present invention can be implemented by forming TiN film 171 and then W film 167 on interlayer insulation film 61 shown in FIG. 6, followed by a patterning step.

Figure 15:
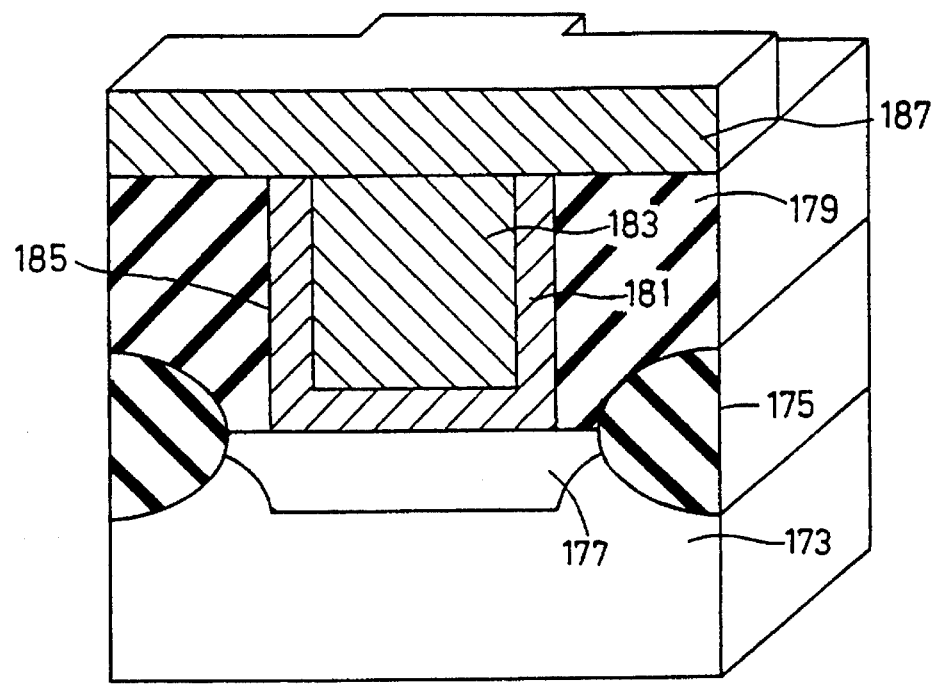
FIG. 15 is a sectional view of a conductive layer connection structure manufactured by an eighth embodiment of the present invention.

FIG. 15 is a sectional view of a conductive layer connection structure manufactured by an eighth embodiment of the present invention. In comparison with the two layered structure of the upper conductive layer in the seventh embodiment of FIG. 14, the upper conductive layer of the eighth embodiment has a single structure formed of only TiN film 187. Therefore, the layer extending over the upper conductive layer and also the underlying interlayer insulation film 179 will have a further reduced stepped portion therein. The semiconductor device having the present conductive layer connection structure includes silicon substrate 173, field oxide film 175, impurity region 177, interlayer insulation film 179, TiSi$_2$ film 181, TiN film 183, and through-hole 185.

Figure 16:
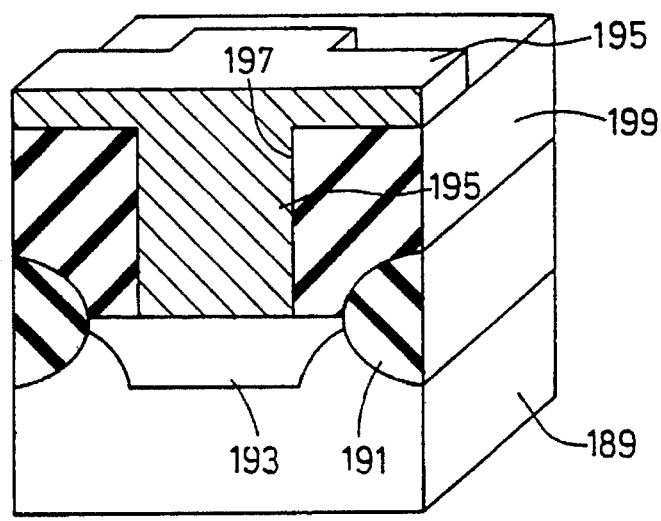
FIG. 16 is a sectional view of a conductive layer connection structure manufactured by a ninth embodiment of the present invention.
Figure 17:
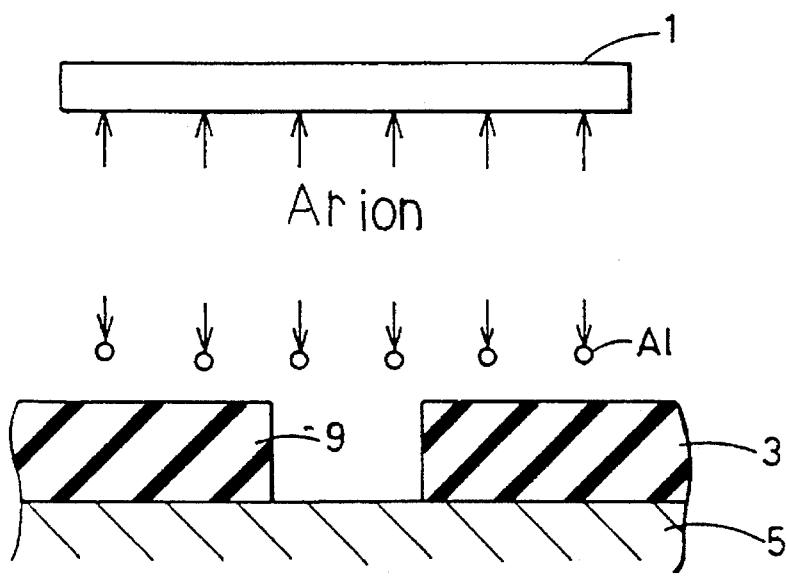
FIGS. 17–19 are sectional views showing a first, a second, and a third step, respectively, of a formation of an aluminum film by an ideal sputtering method.
Figure 18:
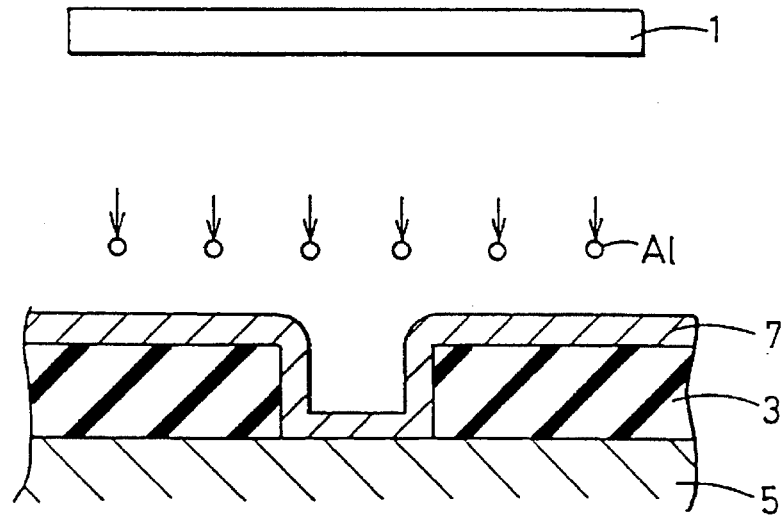
Figure 19:
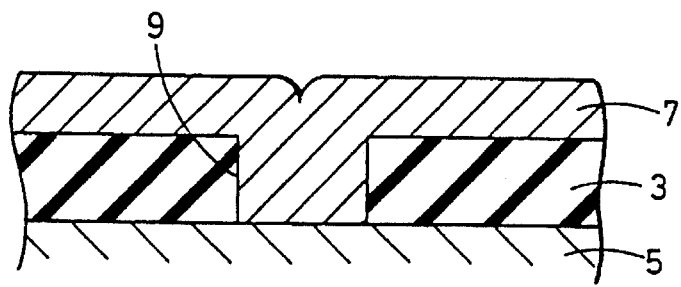
Figure 20:
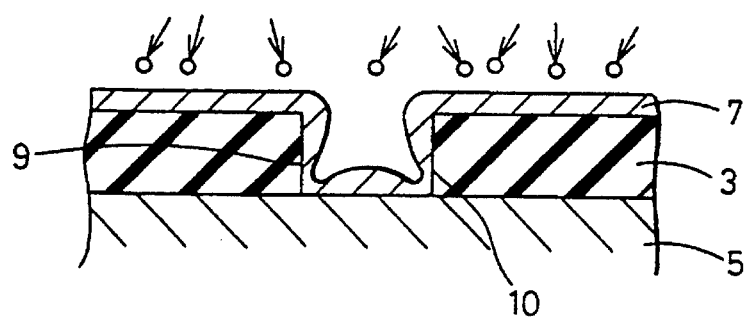
FIG. 20 is a sectional view indicating a formation of an aluminum film by actual sputtering.
Figure 21:
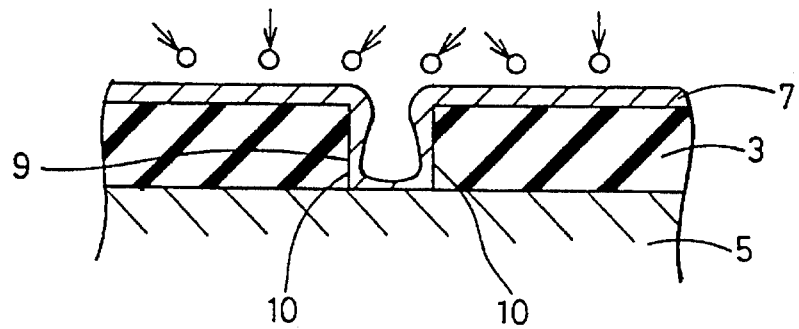
FIGS. 21 and 22 are sectional views showing a first step and a second step, respectively, of a formation of an aluminum film by sputtering in a through-hole having a high aspect ratio.
Figure 22:
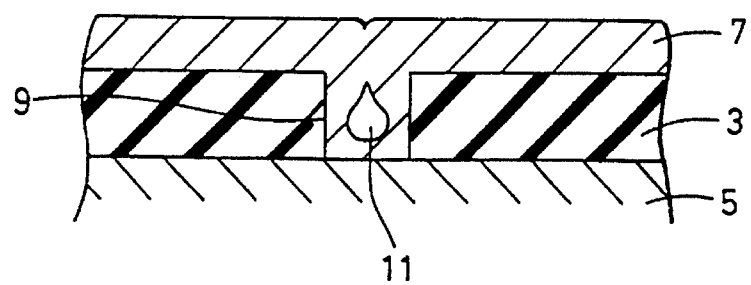
Figure 23:
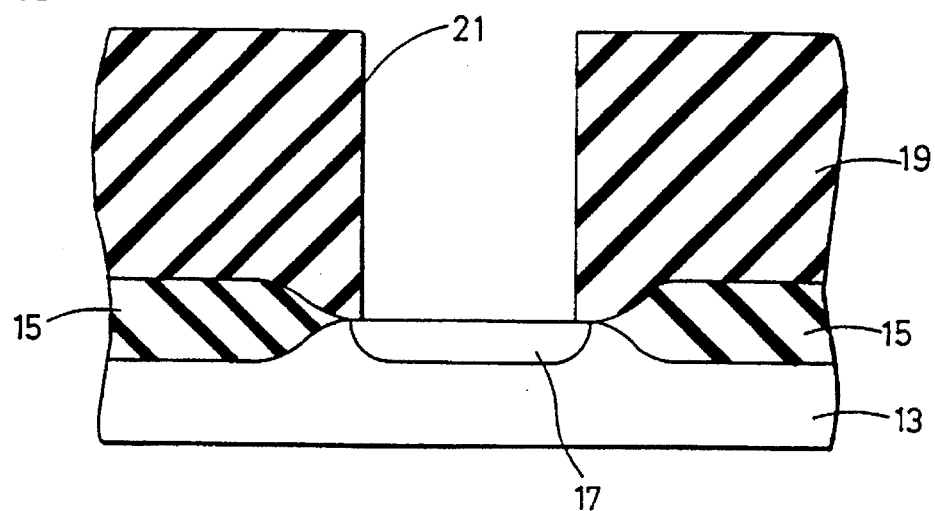
FIGS. 23–28 are sectional views of a conductive layer connection structure of a conventional semiconductor device showing first–sixth steps, respectively, of manufacturing thereof.
Figure 24:
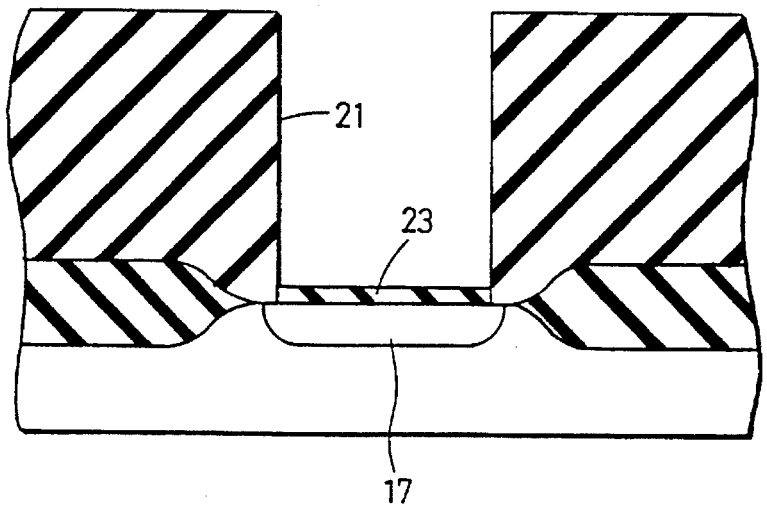
Figure 25:
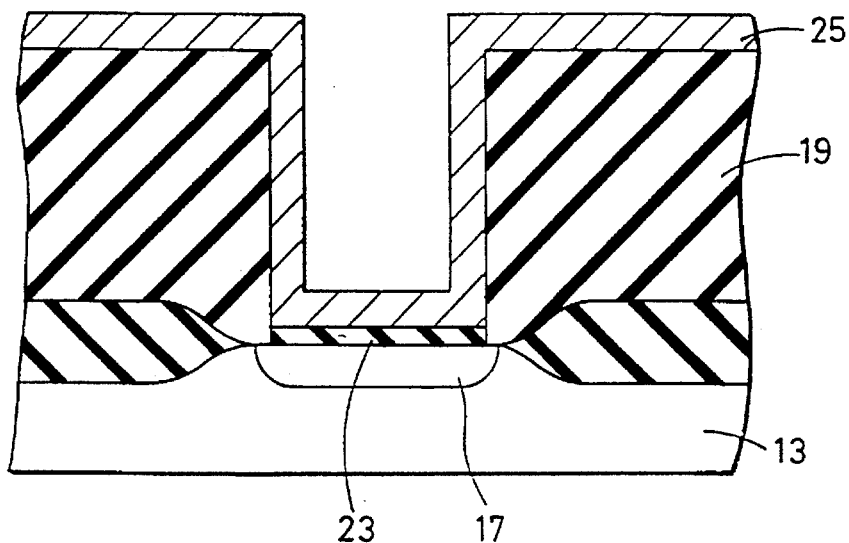
Figure 26:
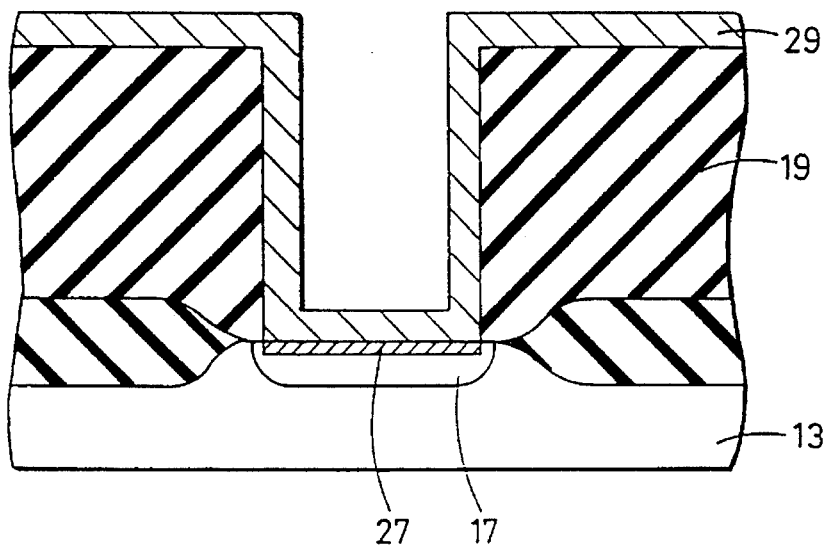
Figure 27:
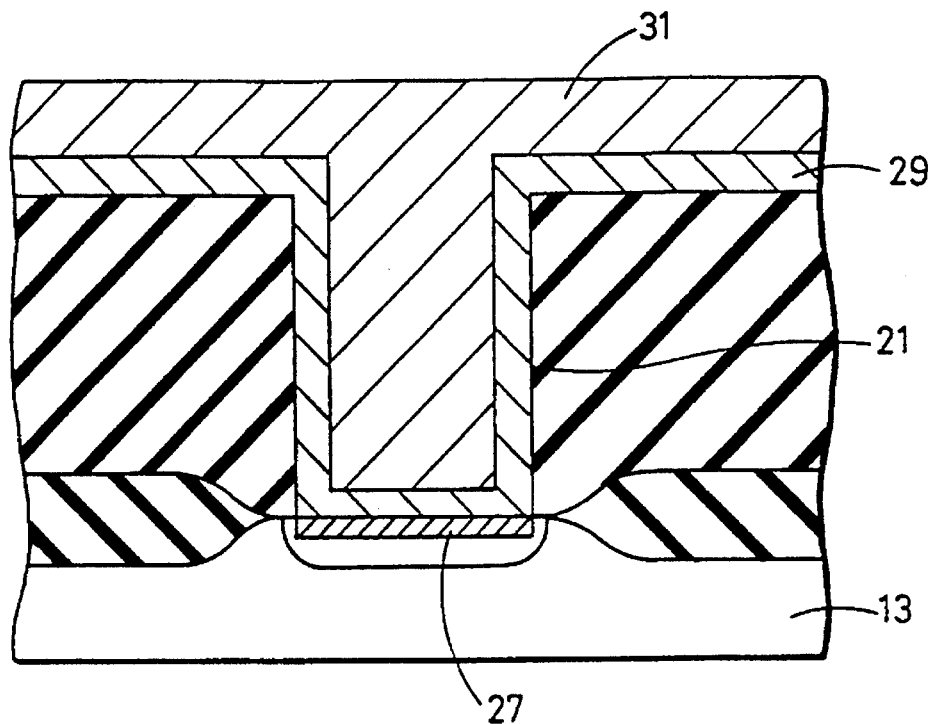
Figure 28:
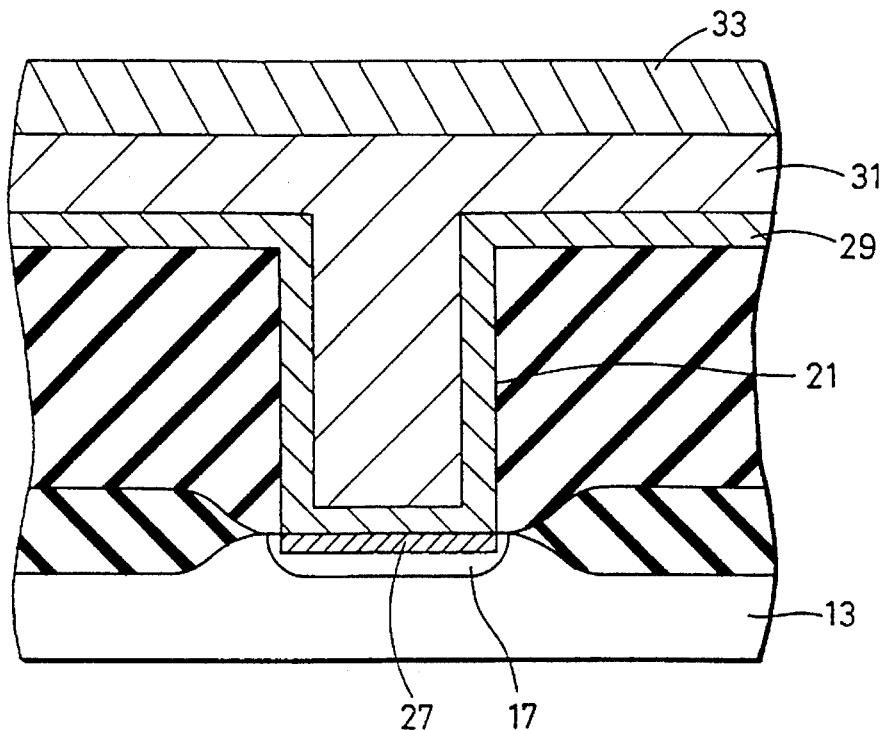
Figure 29:
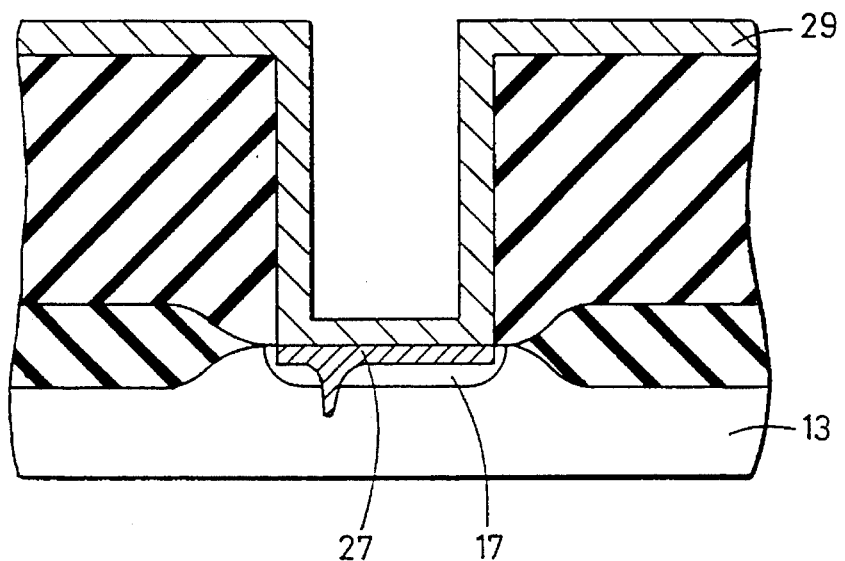
FIG. 29 is a sectional view of a semiconductor device showing the state of a titanium silicide film destructing a pn junction.

FIG. 16 is a sectional view of a conductive layer connection structure manufactured by a ninth embodiment of the present invention. TiN film 195 filled in through-hole 197 is established as the upper conductive layer in the present embodiment. The semiconductor device having the present conductive layer connection structure includes silicon substrate 189, field oxide film 191, impurity region 193, and interlayer insulation film 199. The ninth embodiment comprises the manufacturing step of FIG. 13(b), followed by a patterning step of TiN film 149.

Although a TiN film is filled in the through-holes of embodiments 1–5, embodiment 7, and embodiment 8, a Ti film may be filled up in the through-hole instead.

Although a TiN film is filled in through-hole of the sixth and ninth embodiments, the through-hole may be filled up with only a Ti film or only a TiSi$_2$ film.

According to the aspect of the present invention, the silicon used for the formation of a titanium silicide layer is supplied from a gas including silicon. Therefore, the titanium silicide layer can be prevented from intruding excessively into the lower conductive layer. Therefore, the problem of destruction in the pn junction caused by excessive intrusion of the titanium silicide layer into a lower conductive layer can be prevented.

According to another aspect of the present invention, the titanium nitride formed in a through-hole comprises only TiN. Therefore, the electrical resistance of the conductive layer in a through-hole can be reduced in comparison with the cases where the titanium nitride is TiN and TiN (O).

According to a further aspect of the present invention, the thickness of the upper conductive layer can be reduced. Therefore, the layer formed on the upper conductive layer can have its step reduced. Because the step in the layer can be reduced, disconnection of the interconnection layer formed on this layer can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A conductive layer connection structure of a semiconductor device electrically connecting an upper conductive layer and a lower conductive layer having a main surface, said conductive layer connection structure comprising:

an insulation layer formed on said lower conductive layer, said insulating layer having a lower surface in contact with the main surface of said lower conductive layer and an upper surface, said insulating layer further having a through-hole with sidewalls reaching from said upper surface to said lower surface, a titanium silicide layer formed on said main surface of said lower conductive layer in said through-hole, a connection conductive layer fully filling the through-hole and consisting of titanium nitride in said through-hole, extending to said upper surface of said insulation layer, and electrically connecting said titanium silicide layer and said upper conductive layer, said titanium nitride connection conductive layer being in direct surface contact with said titanium silicide layer, wherein titanium nitride in said through-hole includes no oxygen, wherein said upper conductive layer electrically connected with said connection conductive layer is formed on said insulation layer; and wherein substantially the entire sidewalls of said through-hole has said titanium silicide layer formed thereon.

2. The conductive connection structure according to claim 1, wherein said lower conductive layer comprises an impurity region including silicon.

3. The conductive layer connection structure according to claim 1, wherein said lower conductive layer comprises a source/drain region.

4. The conductive layer connection structure according to claim 1, wherein said connection conductive layer and said upper conductive layer are formed of the same material.

5. The conductive connection structure according to claim 1, wherein said upper conductive layer further includes another conductive layer.

6. The conductive connection structure according to claim 5, wherein said another conductive layer comprises tungsten.

7. A semiconductor device comprising:

a semiconductor substrate of silicon of a first conductivity type, having a main surface, a lower conductive layer of an impurity diffusion region of a second conductivity type formed on the main surface of said semiconductor substrate, an insulation layer formed on the main surface of said semiconductor substrate, and having a through-hole with sidewalls formed therein exposing a surface of said lower conductive layer, a titanium silicide layer formed on the exposing surface of said lower conductive layer in said through-hole of said insulation layer, a connection conductive layer fully filling said through-hole of said insulation layer and electrically connecting to said lower conductive layer through said titanium silicide, said connection conductive layer being titanium nitride that includes no oxygen, an upper conductive layer formed on said insulation layer opposite the main surface of said semiconductor substrate, and electrically connected to said lower conductive layer via said connection conductive layer, wherein substantially the entire sidewalls of said through-hole has said titanium silicide layer formed thereon.

8. The semiconductor device according to claim 7, wherein a surface of said connection conductive layer is positioned at a plane identical to the surface of said insulation layer, a portion of said upper conductive layer being provided in contact with a surface of said connection conductive layer.

9. The semiconductor device according to claim 7, wherein said connection conductive layer forms a portion of said upper conductive layer.

10. The semiconductor device according to claim 7, wherein said upper conductive layer comprises a first conductive layer forming a portion of said connection conductive layer, and a second conductive layer formed on the surface of said first conductive layer, and of a material differing from that of said first conductive layer.

11. A semiconductor device comprising:

a semiconductor substrate of silicon of a first conductivity type, having a main surface, a lower conductive layer of an impurity diffusion region of a second conductivity type, formed on the main surface of said semiconductor substrate, an insulation layer formed on the main surface of said semiconductor substrate, having a through-hole with sidewalls formed therein exposing a surface of said lower conductive layer, a titanium silicide layer formed on the exposing surface of said lower conductive layer in the through-hole of said insulation layer, and on the side face of said through-hole of said insulation layer, a connection conductive layer fully filling said through-hole of said insulation layer and electrically connecting to said lower conductive layer through said titanium silicide, said connection conductive layer being titanium nitride, an upper conductive layer formed on the surface of said insulation layer opposite the main surface of said semiconductor substrate, and electrically connected to said lower conductive layer via said connection conductive layer, wherein substantially the entire sidewalls of said through-hole has said titanium silicide layer formed thereon.

12. The semiconductor device according to claim 11, wherein a surface of said connection conductive layer is positioned at a plane identical to the surface of said insulation layer, a portion of said upper conductive layer being provided in contact with the surface of said connection conductive layer.

13. The semiconductor device according to claim 11, wherein said connection conductive layer forms a portion of said upper conductive layer.

14. The semiconductor device according to claim 11, wherein said upper conductive layer comprises a first conductive layer forming a portion of said connection conductive layer, and a second conductive layer formed on the surface of said first conductive layer, and of a material differing from that of said first conductive layer.

15. The semiconductor device according to claim 11 wherein said titanium nitride layer extends to the surface of said insulation layer.

16. A conductive layer connection structure of a semiconductor device electrically connecting an upper conductive layer and a lower conductive layer having a main surface, said conductive layer connection structure comprising:

an insulation layer formed on said lower conductive layer, said insulating layer having a lower surface in contact with the main surface of said lower conductive layer and an upper surface, said insulating layer further having a through-hole with sidewalls reaching from said upper surface to said lower surface;

a titanium silicide layer formed by chemical deposition on said main surface of said lower conductive layer in said through-hole, wherein the titanium silicide layer does not extend into the lower conductive layer;

a connection conductive layer fully filling the through-hole and consisting of titanium nitride in said through-hole, extending to said upper surface of said insulation layer, and electrically connecting said titanium silicide layer and said upper conductive layer, said titanium nitride connection conductive layer being in direct surface contact with said titanium silicide layer, wherein titanium nitride in said through-hole includes no oxygen, wherein said upper conductive layer electrically connected with said connection conductive layer is formed on said insulation layer, and wherein substantially the entire sidewalls of said through-hole has said titanium silicide layer formed thereon.

* * * * *